US006275140B1

(12) United States Patent
Asano

(10) Patent No.: US 6,275,140 B1
(45) Date of Patent: Aug. 14, 2001

(54) ROTARY VARIABLE RESISTOR

(75) Inventor: Masahiro Asano, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 09/430,894

(22) Filed: Nov. 1, 1999

(30) Foreign Application Priority Data

Nov. 2, 1998 (JP) .................................................. 10-311722

(51) Int. Cl.[7] ...................................................... H01L 10/32

(52) U.S. Cl. .......................... 338/162; 338/163; 338/174; 338/188

(58) Field of Search .................................... 338/160, 162, 338/163, 171, 174, 188, 190

(56) References Cited

U.S. PATENT DOCUMENTS

| | | | | |
|---|---|---|---|---|
| 3,579,169 | | 5/1971 | Dickinson . | |
| 4,210,896 | * | 7/1980 | Benthuysen | 338/159 |
| 4,429,297 | * | 1/1984 | Nakatsu | 338/162 |
| 4,839,960 | | 6/1989 | Yokoi et al. . | |
| 4,935,718 | * | 6/1990 | Yagi et al. | 338/162 |
| 4,994,782 | * | 2/1991 | Watanabe et al. | 338/160 |
| 5,059,940 | * | 10/1991 | Thomas, Jr. | 338/164 |
| 5,847,640 | * | 12/1998 | Fukaya et al. | 338/160 |

FOREIGN PATENT DOCUMENTS

| | | |
|---|---|---|
| 02 101 705 | 7/1990 | (JP) . |
| 02 101 708 | 7/1990 | (JP) . |
| 7-245203 | 9/1995 | (JP) . |

OTHER PUBLICATIONS

Japanese Unexamined Utility Model Publication No. 3–81607, 2 pages of English copy, 14 pages of publication and 8 pages of drawings in Japanese, dated Aug. 21, 1991.

* cited by examiner

*Primary Examiner*—Karl D. Easthom
(74) *Attorney, Agent, or Firm*—Brinks Hofer Gilson & Lione

(57) ABSTRACT

A rotary variable resistor includes a substrate made of synthetic resin; a first terminal made of metal, embedded in the substrate, and leading from a side surface of the substrate; an annular collector formed on the surface of the substrate; a resistor formed on the surface of the substrate; and a sliding element sliding on the resistor and the collector. In the rotary variable resistor, an exposed part exposed at the surface of the substrate is formed on the first terminal within a range of the width of the annular collector. Since the exposed part of the first terminal is connected to the annular collector within the width thereof, a space for forming a leader of a conventional collector and a compact rotary variable resistor can be obtained.

15 Claims, 5 Drawing Sheets

ROTARY VARIABLE RESISTOR

BACKGROUND OF THE INVENTION

1. Field of the Invention

The present invention relates to a rotary variable resistor suitable for use in various types of electronic apparatuses.

2. Description of the Related Art

A conventional rotary variable resistor will be described with reference to FIGS. 7 and 8.

A substrate 31 made of a molded article of synthetic resin has a circular base 31*a*, a rectangular leader 31*b*, and a hole formed in the center of the base 31*a*.

Plural terminals 32 and 33 are made of metallic materials and are buried in the leader 31*b* of the substrate 31. Ends 32*a* and 33*a* of the terminals 32 and 33 project outward from a side of the leader 31*b*, and the other ends 32*b* and 33*b* are exposed at the surface of the substrate 31.

A first collector 34 made of a conductive material, such as silver, is formed on the surface of the substrate 31, and has an annular part 34*a* provided around the hole 31*c*, and a leader 34*b* leading from the annular part 34*a* to the leader 31*b*. The leader 34*b* is connected to the other end of one of the terminals 32.

A second collector 35 made of a conductive material, such as silver, is formed on the surface of the substrate 31, and has a circular-arc part 35*a* provided on the outer periphery of the annular part 34*a* and a leader 35*b* leading from the circular-arc part 35*a* to the leader 31*b*. The leader 35*b* is connected to the other end 32*b* of the other one of the terminals 32.

A first resistor 36 is formed on the surface of the substrate 31, and has a horseshoe-shaped resistance part 36*a* formed at the outer periphery of the circular-arc part 35*a* and a leader 36*b* linearly leading from both ends of the resistance part 36*a* to the leader 31*b*. The leader 36*b* is connected to the other end 33*b* of one of the terminals 33.

A second resistor 37 is formed on the surface of the substrate 31 and has a horseshoe-shaped resistance part 37*a* formed on the outer periphery of the resistance part 36*a* of the first resistor 36 and a leader 37*b* linearly leading from both ends of the resistance part 37*a* to the leader 31*b*. The leader 37*b* is connected to the other end 33*b* of one of the terminals 33.

The first and second resistance parts 36*a* and 37*a* are connected to each other at one end thereof.

A knob 38 made of an insulating material is shaped like a disk, and a hole 38 is formed in the center thereof. Two sliding elements 39 and 40 are fixed to the underside of the knob 38.

The sliding element 39 slides on the first collector 34 and the resistance part 36*a* of the first resistor 36, and the sliding element 40 slides on the second collector 35 and the resistance part 37*a* of the second resistor 37.

A shaft 37 is inserted through the hole 38*a* of the knob 38 and the hole 31*c* of the substrate 31 to thereby rotatably mount the knob 38 on the substrate 31.

When the knob 38 is rotated, the slider elements 39 and 40 are rotated, the slider element 39 slides on the first collector 34 and the first resistor 36 to vary the value of resistance between the terminals 32 and 33, and the slider element 40 slides on the second collector 35 and the second resistor 37 to vary the value of resistance between the terminals 32 and 33. This allows the two resistors 36 and 37 to be variable.

In the above-described conventional rotary variable resistor, since the first collector 34 has the leader 34*b* leading from the circular part 34*a* to the leader 31*b* of the substrate 31, a space for providing the leader 34*b* is required and the size of the resistor is thereby increased.

Therefore, the conventional rotary variable resistor is not suitable for size reduction.

In addition, the presence of the leader 34*b* interferes with the approach to both ends of the resistor 36. and therefore an effective angle of the resistor 36 is smaller.

Furthermore, in the first resistor 36, the leader 36*b* leading linearly from both ends of the resistance part 36*a* to the leader 31*b* is provided, and the leader 36*b* is connected to the other end 33*b* of one of the terminals 33. Therefore, the space of the leader 36*b* is increased, and is not suitable for size reduction.

SUMMARY OF THE INVENTION

Accordingly, it is an object of the present invention to provide a rotary variable resistor capable of achieving a reduction in size by effectively using a surface of a substrate.

In accordance with an aspect of the present invention, there is provided a rotary variable resistor including: a substrate comprising synthetic resin; a first terminal comprising metal, embedded in said substrate, and leading from a side surface of the substrate; an annular collector formed on the surface of the substrate; a resistor formed on the surface of the substrate; and a sliding element sliding on the resistor and the collector, wherein an exposed part exposed at the surface of the substrate is formed on the first terminal within a range of the width of the annular collector, and the first terminal is connected to the collector at the exposed part.

In the rotary variable resistor, the sliding element may slide on the collector within a range not including the exposed part of the terminal.

In addition, in the rotary variable resistor, the resistor may be formed in a circular-arc shape on the outer periphery of the collector and both ends of the resistor may be disposed adjacent to each other, and a leader including silver and the like may be formed on the surface of the substrate so as to be curved along the outer shape of the resistor, and an end of the leader may be connected to an end of the resistor.

Furthermore, in the rotary variable resistor, exposed part of the first terminal may be formed at a position opposite to an end of the resistor across a hole formed in the substrate, and a second terminal may be embedded in the substrate, and the second terminal may have an exposed part exposed at the surface of the substrate, and the second terminal may be connected to the leader at the exposed part.

DESCRIPTION OF THE PREFERRED EMBODIMENTS

Figure 1:
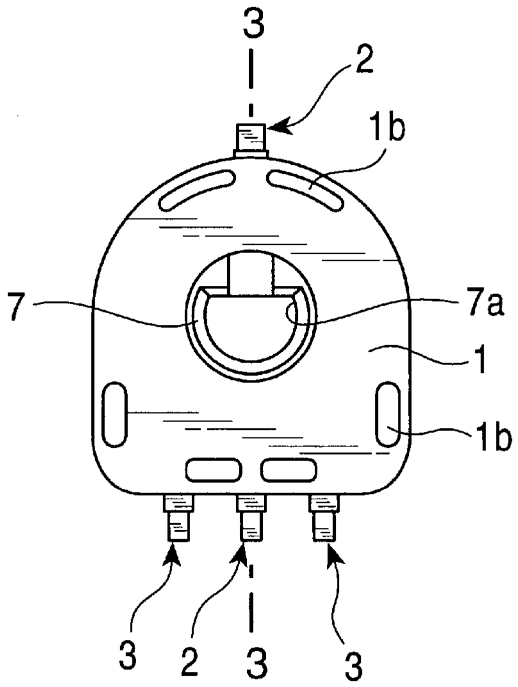
FIG. 1 is a front view showing a rotary variable resistor according to the present invention.
Figure 2:
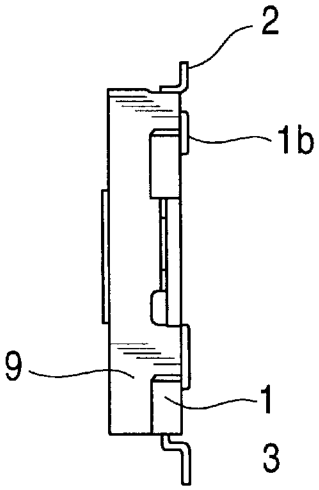
FIG. 2 is a side view of the rotary variable resistor.
Figure 3:
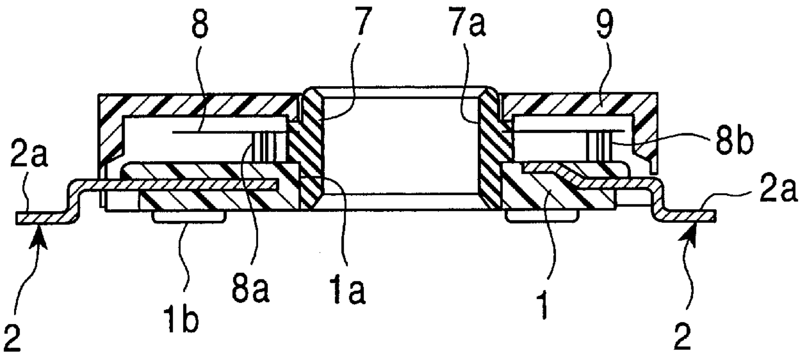
FIG. 3 is a sectional view taken along a line 3—3 in FIG. 1.
Figure 4:
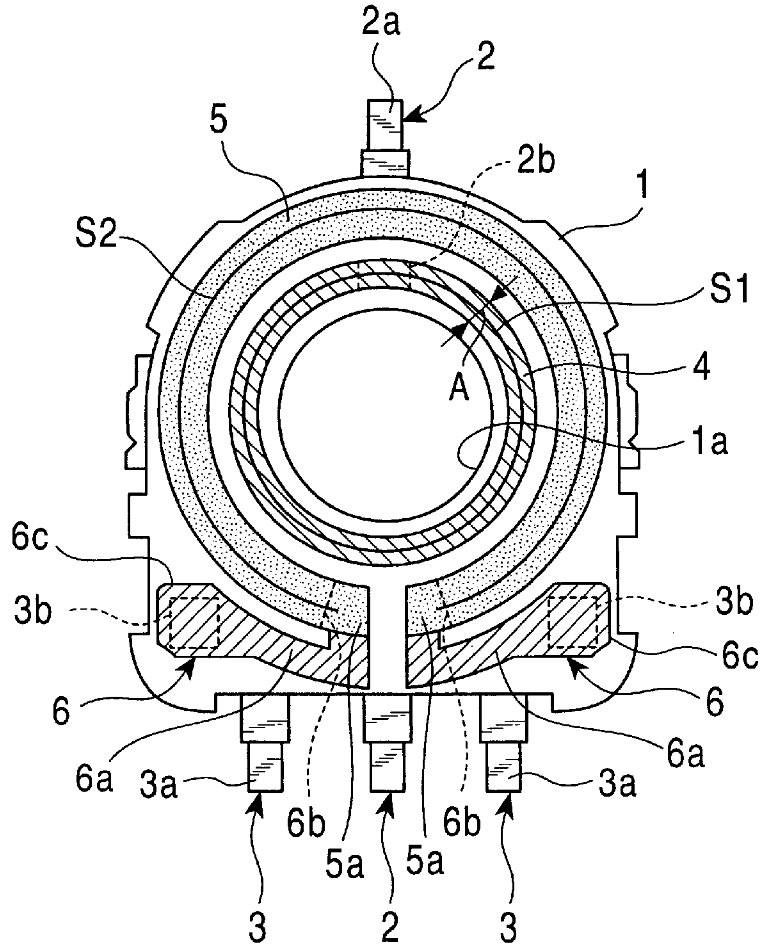
FIG. 4 is a plan view of a substrate in the rotary variable resistor according to the present invention.

A configuration of a rotary variable resistor according to the present invention will now be described with reference to FIGS. 1 to 4.

A substrate 1 made of a molded article of synthetic resin has a hole 1*a* formed in the center thereof, and projections 1b are provided on the outer surface thereof.

Plural terminals 2 and 3 are made of metallic materials and are buried in the substrate 1. Ends of the terminals 2 and 3 project outward from a side of the substrate 1 to form terminal parts 2*a* and 3*a*, and the other ends of the terminals 2 and 3 are exposed at the surface of the substrate 1 to form exposed parts 2*b* and 3*b*.

A collector 4 obtained by baking a paste including a conductive material, such as silver, is formed on the surface of the substrate 1 and is formed in an annular shape around the hole 1*a*. The collector 4 is connected to the exposed part 2*b* of one of the terminals 2 within the width A thereof.

A resistor 5 is formed on the surface of the substrate 1 and is formed in a circular-arc shape provided on the outer periphery of the annular collector 4. Both ends 5*a* of the resistor 5 are disposed adjacent to each other.

Leaders 6 obtained by baking a paste including a conductive material, such as silver, are formed on the surface of the substrate 1, and have curved parts 6*a* curved along the outer shape of the resistor 5, ends 6*b* connected to the lower portions of the ends 5*a* of the resistor 5, and connecting parts 6*c* connected to the exposed parts 3*b* of the terminals 3.

The exposed part 2*b* of the terminal 2 is formed at a position opposite to the ends 5*a* of the resistor 5 across the hole 1*a*.

A shaft 7 made of an insulating material is formed in a cylindrical shape and has a hole 7*a* in the center thereof. A slider 8 made of a metal plate and having armatures 8*a* and 8*b* is fixed to the shaft 7.

The shaft 7 is fitted into the hole 1*a* of the substrate 1 so as to be rotatably mounted thereto. The armature 8*a* slides on the collector 4 except the exposed part 2*b*, i.e., within a range of sliding path S1, and the armature 8*b* slides on the resistor 5 within a range of sliding path S2.

A cover 9 made of a molded article of synthetic resin is formed in a shape of a cup and is mounted on the substrate 1 by a suitable means, such as snapping on, so as to cover the slider 8, resistor 5, and collector 4.

The rotary variable resistor having the configuration as described above has the projections 1*b* of the substrate 1, and terminal parts 2*a* and 3*a* of the terminals 2 and 3, placed on a printed circuit board (not shown), and is surface-mounted on the printed circuit board.

An operation of the rotary variable resistor is as follows. When the shaft 7 is rotated, the slider element 8 is rotated, the armature 8*a* slides on the collector 4 within a range of sliding path S1, and the armature 8*b* slides on the resistor 5 within a range of sliding path S2 to thereby vary the value of resistance between the terminals 2 and 3.

The rotary variable resistor of the present invention is manufactured as follows.

Figure 5:
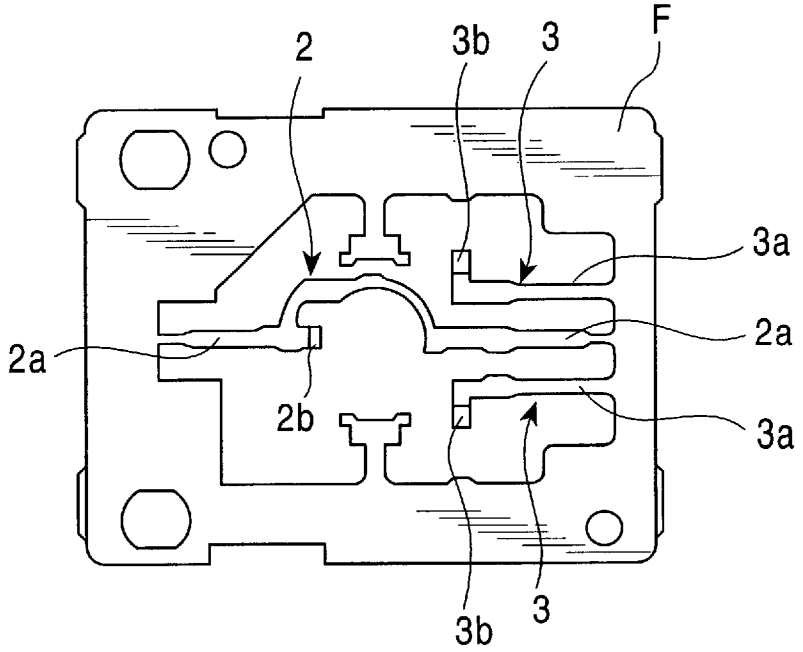
FIG. 5 is an illustration showing a manufacturing method of the rotary variable resistor according to the present invention.

First, as shown in FIG. 5, a material F in the form of a hoop and made from metal plate is punched out, and the terminals 2 having the terminal parts 2*a* and bent exposed part 2*b*, and the terminals 3 having the terminal parts 3*a* and bent exposed parts 3*b* are formed in a state of being connected to the hoop material F.

Figure 6:
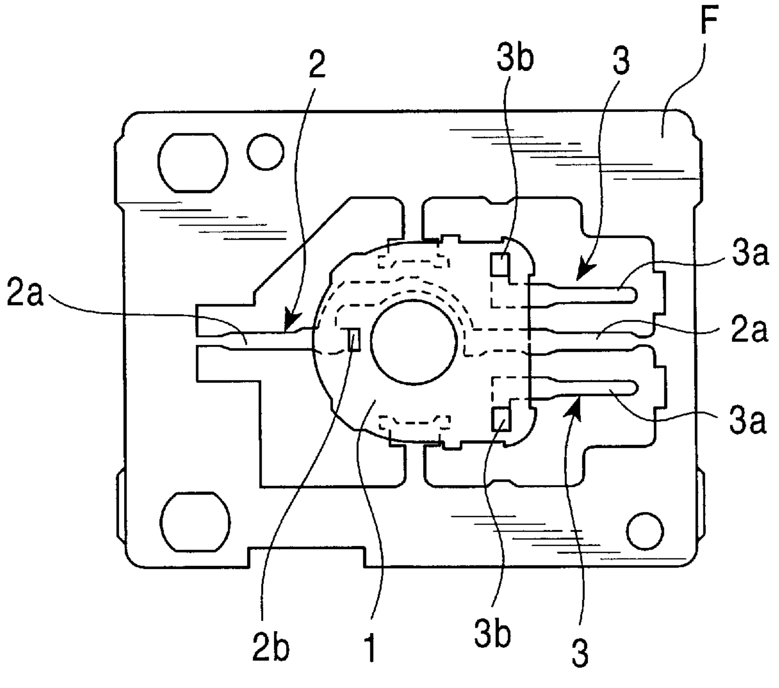
FIG. 6 is an illustration showing a manufacturing method of the rotary variable resistor according to the present invention.
Figure 7:
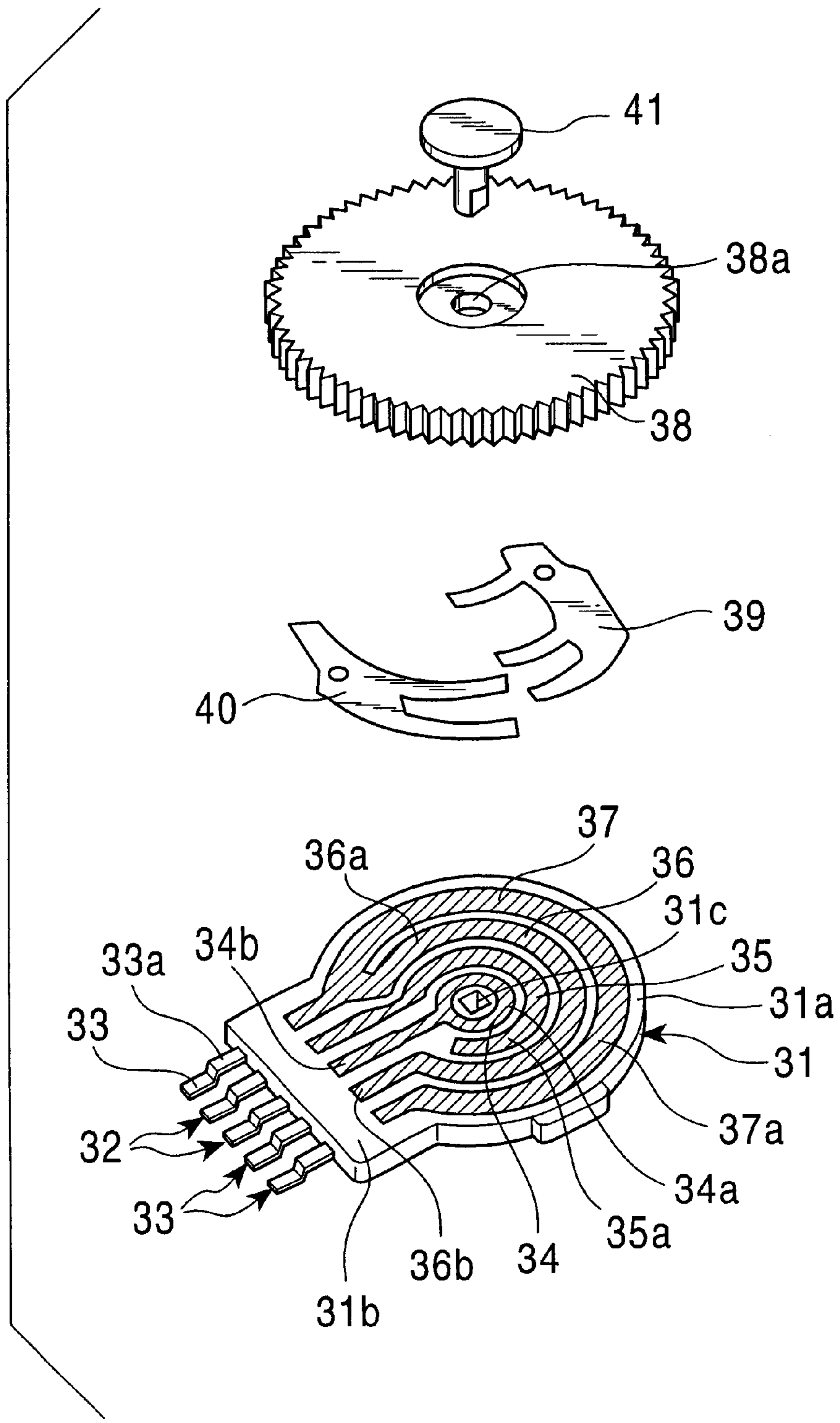
FIG. 7 PRIOR ART
FIG. 7 is an exploded perspective view showing a conventional rotary variable resistor.
Figure 8:
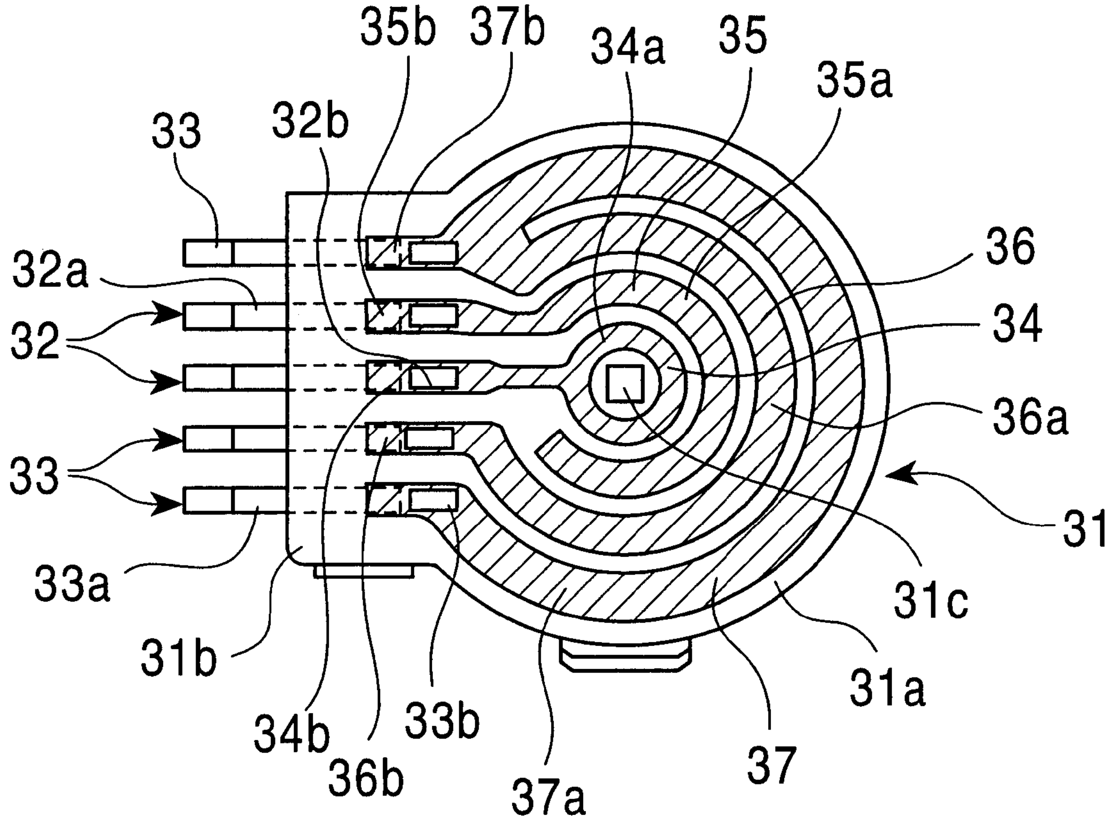
FIG. 8 PRIOR ART
FIG. 8 is a plan view of a substrate in the conventional rotary variable resistor.

Then, as shown in FIG. 6, the terminals 2 and 3 are buried by molding the synthetic resin substrate 1 so that the terminal parts 2*a* and 3*a* are projected outward and the exposed parts 2*b* and 3*b* are exposed at the surface of the substrate 1.

Thereafter, the collector 4 and the resistor 5 are formed on the substrate 1 by printing and the like.

According to the rotary variable resistor of the present invention, since the exposed part 2*b* of the terminal 2 is connected to the annular collector 4 within a range of the width of the collector 4, a space for forming the leader 34*b* of the conventional collector 34 is not required, and the surface of the substrate 1 can be effectively used. Therefore, a small-sized rotary variable resistor can be obtained.

In addition, since the conventional leader 34*b* is not required, the effective angle of the resistor 5 can be increased, and a rotary variable resistor of large variable range can be obtained.

Since the sliding element 8 slides on the collector 4 except the exposed part 2*b* of the terminal 2, the wear on the slider 8 is small and a rotary variable resistor having a long service life can be obtained.

In addition, since both ends 5*a* of the resistor 5 are adjacent to each other, the effective angle of the resistor 5 can be increased, and a rotary variable resistor of large variable range can be obtained.

Furthermore, since the leader 6 is curved along the outer shape of the resistor 5, the size of the substrate 1 can be reduced compared to conventional rotary variable resistors in which a linear leader 36*b* leads to the leader 31*b* of the substrate 31. Therefore, a compact rotary variable resistor can be obtained.

In addition, by providing the exposed part 2*b* of the terminal 2 at a position opposite to the ends 5*a* of the resistor 5 across the hole 1*a* of the substrate 1, the armature 8*a* of the slider 8 sliding on the collector 4 and the armature 8*b* sliding on the resistor 5 can be positioned on opposite sides of shaft 7, resulting in a superior rotation balance of the shaft 7. Therefore, a rotary variable resistor providing a superior rotating action can be obtained.

What is claimed is:

1. A rotary variable resistor comprising:

a substrate comprising synthetic resin;

a shaft rotatably connected to a hole formed in said substrate and comprising a sliding element;

an annular collector formed on the surface of said substrate by printing a conductive material on said substrate, said collector being formed around said hole and comprising a surface that is engaged by said sliding element;

a resistor formed on the surface of said substrate by printing a conductive material on said substrate, said resistor being generally formed around an outer periphery of said collector, said resistor comprising a split circular-arc shape and terminating in a pair of resistor ends, said resistor further comprising a surface that is engaged by said sliding element;

a first terminal formed of metal and embedded in said substrate, said first terminal comprising a terminal part and an exposed part, said terminal part being formed by extending said metal from a side surface of said substrate, said exposed part being formed by filling an exposing hole formed in a portion of said substrate with said metal, said exposing part being located below an annular part of said collector and exposed at the surface of said substrate, said first terminal being electrically connected to said collector by printing said collector on said exposed part;

a pair of second terminals formed of metal and embedded in said substrate, each second terminal comprising a terminal part and an exposed part, said terminal parts each being formed by extending said metal from a side surface of said substrate, said exposed parts each being formed by filling an exposing hole formed in a portion of said substrate with said metal, said exposing parts being located near said pair of resistor ends and exposed at the surface of said substrate; and a pair of leaders formed by printing a conductive material on the surface of said substrate, each said leader connecting one of said pair of said resistor ends with the exposed part of one of said pair of second terminals;

wherein said sliding element slides on the surface of said resistor and on the surface of said collector by the rotation of said shaft, and wherein said first terminal has an external shape which comprises a first portion linearly extending from said terminal part to said exposed part, a second portion extending from the exposed part along an arc of said hole, and a third portion extending linearly from said second portion in a direction parallel with said first portion, said third portion extending from a side surface of said substrate.

2. A rotary variable resistor according to claim 1, wherein said resistor ends are disposed adjacent to each other.

3. A rotary variable resistor according to claim 1, wherein said exposed part of said first terminal is formed near a side of said hole that is opposite to a side of said hole near said resistor ends.

4. A rotary variable resistor according to claim 1, wherein an exposed area portion of said exposed part of said first terminal is sized so as to fit within a radial width of said annular part of said collector.

5. A rotary variable resistor according to claim 1, wherein the conductive material used for printing said collector comprises silver.

6. A rotary variable resistor according to claim 1, wherein the conductive material used for printing said pair of leaders comprises silver.

7. A rotary variable resistor according to claim 1, wherein the third portion of said first terminal is located between said pair of second terminals.

8. A rotary variable resistor comprising:

a substrate comprising synthetic resin and having a flat portion formed on a surface thereof;

a shaft rotatably connected to a hole formed in said substrate and comprising a sliding element;

an annular collector formed on the flat portion of the surface of said substrate by printing a conductive material on said substrate, said collector being formed around said hole and comprising a surface that is engaged by said sliding element;

a resistor formed on the flat portion of the surface of said substrate by printing a conductive material on said substrate, said resistor being generally formed around an outer periphery of said collector, said resistor comprising a split circular-arc shape and terminating in a pair of resistor ends, said resistor further comprising a surface that is engaged by said sliding element;

a first terminal formed from a metal plate embedded in said substrate and comprising a terminal part and an exposed part, said terminal part being formed by extending said metal plate from a side surface of said substrate, said exposed part being formed by filling an exposing hole formed in a portion of said substrate with said metal plate, said exposing part being located below an annular part of said collector and exposed at the surface of said substrate, said first terminal being electrically connected to said collector by printing said collector on said exposed part; and a pair of second terminals each formed from a metal plate embedded in said substrate and each comprising a terminal part and an exposed part, said terminal parts each being formed by extending said metal plate from a side surface of said substrate, said exposed parts each being formed by filling an exposing hole formed in a portion of said substrate with said metal plate, each said exposing part being electrically connected to one of said pair of said resistor ends;

wherein said sliding element slides on the surface of said resistor and on the surface of said collector by the rotation of said shaft, and wherein said first terminal has an external shape which comprises a first portion linearly extending from said terminal part to said exposed part, a second portion extending from the exposed part along an arc of said hole, and a third portion extending linearly from said second portion in a direction parallel with said first portion, said third portion extending from a side surface of said substrate.

9. A rotary variable resistor according to claim 8, wherein said exposed parts of said pair of second terminals are disposed near said pair of said resistor ends, and wherein a pair of leaders are formed on the surface of said substrate by printing a conductive material on the surface of said substrate, each said leader electrically connecting one of said pair of said resistor ends with the exposed part of one of said pair of second terminals.

10. A rotary variable resistor according to claim 8, wherein said resistor ends are disposed adjacent to each other.

11. A rotary variable resistor according to claim 8, wherein said exposed part of said first terminal is formed near a side of said hole that is opposite to a side of said hole near said resistor ends.

12. A rotary variable resistor according to claim 8, wherein an exposed area portion of said exposed part of said first terminal is sized so as to fit within a radial width of said annular part of said collector.

13. A rotary variable resistor according to claim 8, wherein the conductive material used for printing said collector comprises silver.

14. A rotary variable resistor according to claim 9, wherein the conductive material used for printing said pair of leaders comprises silver.

15. A rotary variable resistor according to claim 8, wherein the third portion of said first terminal is located between said pair of second terminals.

* * * * *